(12) United States Patent
Kurokawa (10) Patent No.: US 8,502,724 B2
(45) Date of Patent: Aug. 6, 2013

(54) SEMICONDUCTOR DEVICE AND METHOD FOR DRIVING THE SAME

(75) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/432,041

(22) Filed: Mar. 28, 2012

(65) Prior Publication Data

US 2012/0249190 A1    Oct. 4, 2012

(30) Foreign Application Priority Data

Apr. 1, 2011    (JP) .................................. 2011-081376

(51) Int. Cl.
*H03M 1/34*    (2006.01)

(52) U.S. Cl.
USPC ................. 341/164; 345/78; 345/76; 345/73; 345/84; 345/204; 313/463; 315/169.1; 315/169.2; 315/169.3; 315/169.4; 341/155; 341/160; 341/162; 341/163; 348/294; 348/308

(58) Field of Classification Search
USPC .......................... 341/155, 160–160; 313/463; 315/169.1–169.4; 345/73–84, 204–215; 348/294, 308
See application file for complete search history.

(56) References Cited

U.S. PATENT DOCUMENTS

| | | | | |
|---|---|---|---|---|
| 5,180,987 A | * | 1/1993 | Wendt | 327/105 |
| 5,769,873 A | * | 6/1998 | Zadeh | 607/29 |
| 5,841,284 A | * | 11/1998 | Takahashi | 324/428 |
| 6,075,478 A | * | 6/2000 | Abe | 341/155 |
| 6,081,140 A | * | 6/2000 | King | 327/77 |
| 6,157,170 A | * | 12/2000 | Noda et al. | 320/132 |
| 6,693,577 B2 | | 2/2004 | Yamamoto | |
| 6,791,610 B1 | * | 9/2004 | Butler et al. | 348/297 |
| 6,876,345 B2 | * | 4/2005 | Akimoto et al. | 345/76 |
| 7,405,689 B2 | * | 7/2008 | Kernahan et al. | 341/156 |
| 7,609,185 B2 | * | 10/2009 | Kernahan et al. | 341/120 |

(Continued)

FOREIGN PATENT DOCUMENTS

| | | |
|---|---|---|
| JP | 2003032114 A | 1/2003 |
| JP | 2010-268139 A | 11/2010 |

OTHER PUBLICATIONS

Hiroshi Kageyama et al.; "40.3: A 2.5-inch Low-power LTPS AMOLED Display-using Clamped-Inverter Driving-for Mobile Applications"; SID Digest '06 : SID International Symposium Digest of Technical Papers; 2006; pp. 1455-1458.

Seyed Danesh et al.; "A Reconfigurable 1GSps to 250MSps, 7-bit to 9-bit Highly Time-Interleaved Counter ADC in 0.13μm CMOS"; 2011 Symposium on VLSI Circuits Digest of Technical Papers; 2011; pp. 268-269.

*Primary Examiner* — Lam T Mai
(74) *Attorney, Agent, or Firm* — Fish & Richardson P.C.

(57) ABSTRACT

To provide a semiconductor device including an A/D converter circuit that is capable of performing A/D conversion with high accuracy and high resolution and that can be reduced in size. One loop resistance wiring is shared by a plurality of power supply switches and a plurality of output circuits, and a reference voltage having a triangular (step-like) wave generated using the resistance wiring and the plurality of power supply switches is utilized. Thus, high-accuracy digital signals can be obtained using such an A/D converter circuit that can be reduced in size as an output circuit, without using a complicated circuit structure. Further, the number of constituent elements of the A/D converter circuit is small, whereby in the case of providing A/D converter circuits in parallel, variation between the A/D converter circuits can be made small.

17 Claims, 6 Drawing Sheets

U.S. PATENT DOCUMENTS 7,932,881 B2 * 4/2011 Kageyama et al. ............. 345/78
8,004,442 B2 * 8/2011 Barrenscheen et al. ...... 341/155
8,115,664 B2    2/2012 Kamikisaki
8,125,550 B2 * 2/2012 Su et al. ........................ 348/294

* cited by examiner

SEMICONDUCTOR DEVICE AND METHOD FOR DRIVING THE SAME

BACKGROUND OF THE INVENTION

1. Field of the Invention

The present invention relates to a semiconductor device and a method for driving the semiconductor device, and in particular to a semiconductor device including a plurality of analog-to-digital (A/D) converter circuits and a method for driving the semiconductor device. Further, the present invention relates to a semiconductor device in which the A/D converter circuits are used as output circuits and a method for driving the semiconductor device.

2. Description of the Related Art

With the progress of miniaturization of semiconductor elements, a larger capacity of memories and higher performance of CPUs have become possible. As a new function added to digital electronic devices including such memories or CPUs, sensor technology has attracted attention. For example, by mounting acceleration sensors or gyro sensors on portable media players, smartphones, or the like, a range of use thereof can be expanded dramatically. Further, as image pickup elements of various kinds of cameras or video cameras or as sensors of optical mice or two-dimensional barcode readers, image sensors that capture images are practically used in many fields.

Figure 6:
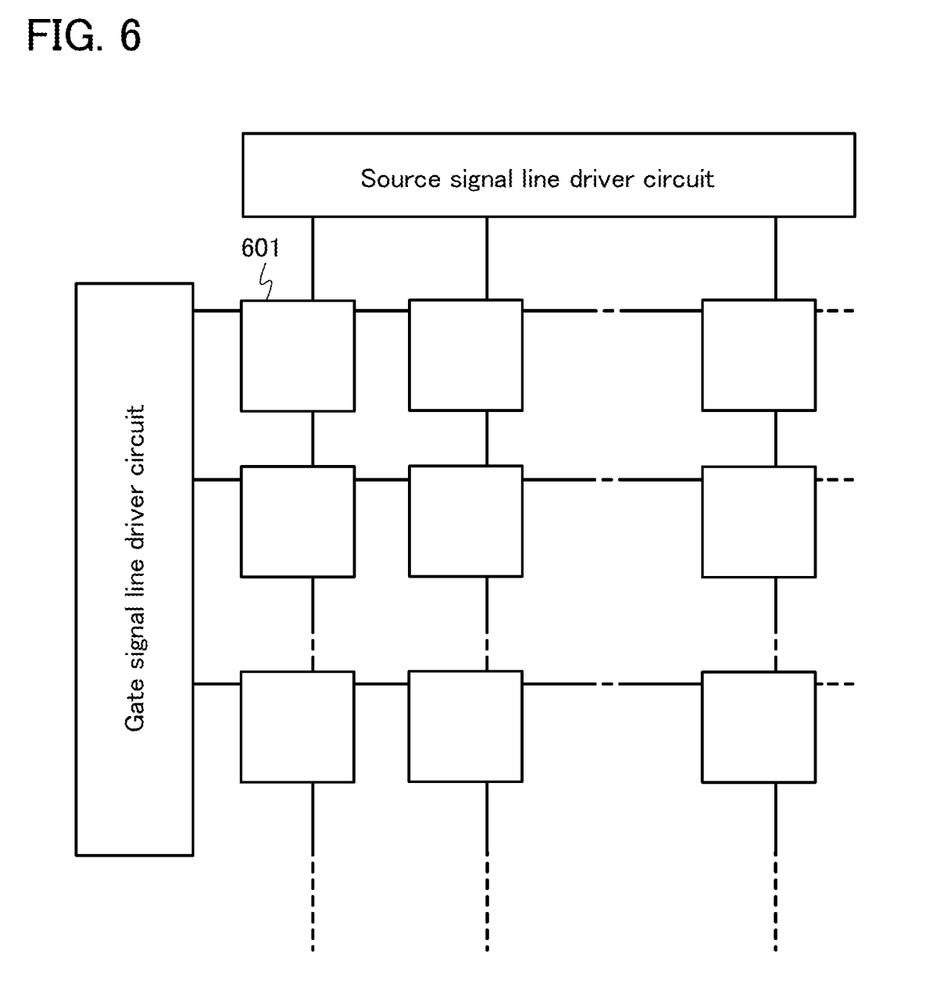
FIG. 6 illustrates pixels arranged in a two-dimensional array.

Image sensors are devices capable of generating a subject image in such a manner that an optical sensor in each of pixels 601 that are arranged in a two-dimensional array as illustrated in FIG. 6 receives light emitted or reflected from a subject, the brightness of the received light is converted (photoelectrically converted) into electric signals, and the electric signals are sequentially read out from each pixel. Currently-used general image sensors are classified roughly into two types: a charge coupled device (CCD) image sensor and a complementary metal oxide semiconductor (CMOS) image sensor.

A CCD image sensor sequentially carries electrons accumulated by photoelectric conversion in pixels that are arranged in a two-dimensional array to an output circuit by its transfer function and outputs signals from the output circuit. A CMOS image sensor selects pixels, in which electrons are amplified, by X-Y addressing and outputs signals from an output circuit. In the CCD image sensor, all the pixels are addressed at the same time and signals are output only in the arrangement order of the pixels, while in the CMOS image sensor, switching of transistors are controlled and addressing is repeated on a row basis so that signals can be output regardless of the arrangement order of the pixels. As the output circuits of the CMOS image sensor, parallelly-provided A/D converter circuits are mainly employed. The parallelly-provided A/D converter circuits can speedily convert signals that are output from photosensors of the pixels.

In the case of incorporating the above-described sensors in electronic devices, A/D conversion is necessary. A/D conversion means converting analog signals into digital signals. A circuit which performs A/D conversion is called A/D converter circuit. For example, signals output from photosensors in pixels of an image sensor are analog signals, and in order to use the analog signals directly in an electronic device, the analog signals need to be converted into digital signals. To obtain desired digital signals, circuit design of a signal path is extremely crucial.

That is, it is desirable to properly design an A/D converter circuit that takes accuracy and resolution into consideration in accordance with the performance needed for desired digital signals. The accuracy of the A/D converter circuit is indicated by S/N ratio. S/N ratio is a ratio of signal to noise, and a higher S/N ratio means higher accuracy. In addition, a lower resolution causes a larger error at the time of converting analog signals into digital signals, thereby making it difficult to obtain a favorable S/N ratio.

As types of the A/D converter circuit, there are an integrating type, a successive approximation type, and a flash type, for example. In the integrating type, an integrator whose input voltage is a measurement voltage is used and an output value is obtained from a rate of change of an output of the integrator. Patent Document 1 discloses an integrating A/D converter circuit that uses low-frequency clocks for A/D conversion for the purpose of small power consumption and has a wide dynamic range. In the successive approximation type, a comparator compares a reference voltage obtained as an output of a D/A converter circuit with a measurement voltage; based on the comparison results, the output of the D/A converter circuit is sequentially changed; thus, an output value is obtained. Patent Document 2 discloses a successive approximation type A/D converter circuit whose processing time is effectively shortened by reducing the time required to re-execute comparator operation and to perform switching from the comparator function to the A/D conversion function. In the flash type, different reference voltages are input to a plurality of comparators, a measurement voltage is compared with the reference voltages, and an output value is obtained from the comparison results.

Further, with the recent rapid progress of miniaturization of pixels in the above-described sensors, size reduction of a peripheral circuit on a chip is also expected. CMOS image sensors have a great advantage of integrating various functional circuits on a chip; however, they tend to have a significant problem in size reduction of A/D converter circuits that are provided in parallel for columns of a pixel array. In order to obtain desired digital signals, the A/D converter circuits are required to have high performance as well as to have a reduced size.

REFERENCE

Patent Document

[Patent Document 1] Japanese Published Patent Application No. 2003-32114

[Patent Document 2] Japanese Published Patent Application No. 2010-268139

SUMMARY OF THE INVENTION

However, in general, achieving an A/D converter circuit having high accuracy and high resolution comes with complicated circuit design. A digital signal can be obtained by conversion by the A/D converter circuit in such a manner that an entire range of an input voltage (analog signal) is divided equally, and the input voltage is compared with a reference voltage and quantized. The larger the division number is, the higher the resolution becomes and the smaller the error between the digital signal and the input voltage becomes. That is, the division number of the input voltage, the number of reference voltages necessarily needed by dividing the input voltage, and the accuracy of the reference voltages themselves directly affect the resolution level and the reliability of the A/D converter circuit. Therefore, in order to obtain many reference voltages corresponding to the division number or to heighten the accuracy of the reference voltages themselves, the circuit area is sacrificed in many cases. In other words, an increase in circuit size is inevitable in order to heighten the resolution of the A/D converter circuit and to obtain high-accuracy digital signals.

For example, in the integrating A/D converter circuit, an OP amplifier having high accuracy, that is, having large circuit size, is necessary for the structure of an integrating circuit. Further, in the successive approximation type A/D converter circuit, a plurality of resistors or capacitors is necessary for each D/A converter circuit. In the flash A/D converter circuit, the number of necessary comparators is proportional to the resolution. In this manner, it is extremely difficult to achieve a reduction in circuit size of these A/D converter circuits.

In view of the above-described problems, it is an object of an embodiment of the present invention to provide a semiconductor device including an A/D converter circuit that is capable of performing A/D conversion with high accuracy and high resolution and that can be reduced in size and a method for driving the semiconductor device.

Further, another object of an embodiment of the present invention is to provide a semiconductor device including a readout circuit that is capable of outputting a high-accuracy digital signal and that can be reduced in size and a method for driving the semiconductor device.

The above-described objects are achieved by sharing one loop resistance wiring. Specifically, one loop resistance wiring is shared by a plurality of power supply switches (switches which control output signals of two shift register circuits) and a plurality of output circuits, and a reference voltage having a triangular (step-like) wave generated using the resistance wiring and the plurality of power supply switches is utilized in order to achieve the above-described objects.

A readout circuit mounted on a semiconductor device includes a plurality of output circuits provided for sensor array's respective columns, one reference voltage generation circuit, a plurality of sensor output signal lines, a plurality of reference voltage output signal lines, and an output signal line.

The output circuits each include an A/D converter circuit and a sample-and-hold circuit. Note that the output circuits may each consist of only an A/D converter circuit without including a sample-and-hold circuit. The output circuit receives and converts a voltage (analog signal) that is output from its corresponding pixel and outputs a digital signal.

The sample-and-hold circuit captures a voltage (analog signal) that is output from its corresponding pixel at a certain timing, holds the value of the voltage constant, and outputs the voltage to the A/D converter circuit.

The A/D converter circuit includes a comparator and a counter. The counter may be a non-synchronous counter or a synchronous counter. The comparator may be a switched capacitor comparator or a differential amplifier circuit. A/D conversion in the A/D converter circuit is performed in such a manner that a voltage (analog signal) input from the sample-and-hold circuit is compared with a reference voltage by the comparator, digitalized through the counter, and output as a digital signal. Note that the digital signal output from the output circuit and the digital signals output from the A/D converter circuit are the same signal.

By holding the voltage input to the A/D converter circuit constant, the sample-and-hold circuit can prevent a reduction in reliability of the A/D converter circuit, which may otherwise be caused by a change in the input voltage during A/D conversion. The structure of the output circuit including the sample-and-hold circuit can produce higher-accuracy digital signals than the structure of the output circuit that does not include the sample-and-hold circuit.

The reference voltage generation circuit includes one loop resistance wiring, a plurality of power supply switches, a plurality of shift register circuits, and two power supply lines. With the power supply lines, at least two levels of voltage are supplied to the loop resistance wiring. The loop resistance wiring consists of a plurality of resistors connected in series in a loop shape. The on/off of the power supply switches provided for each stage of the two shift registers is controlled by output signals that are output from each stage of the shift registers; thus, the voltage supplied to the loop resistance wiring can be controlled. The reference voltage generation circuit having the above-described structure can generate a reference voltage having a triangular (step-like) wave which changes (increases and decreases) with time using the resistance wiring and the plurality of power supply switches and output the generated reference voltage to the output circuits provided for the respective columns of the pixel array. That is, the plurality of output circuits can receive all levels of the triangular (step-like) wave as reference voltages. Accordingly, without a complicated circuit structure, many reference voltages can be obtained in order to achieve A/D converter circuits having high resolution.

The number of reference voltages depends on the resistance division number of the loop resistance wiring. The resistance division number can be controlled by the control of the plurality of power supply switches. When the triangular (step-like) wave generated by the reference voltage generation circuit is smoother, the resistance division number of the loop resistance wiring is larger and the number of reference voltages is higher. That is, the value of the input voltage can be read more correctly Therefore, by increasing the resistance division number of the loop resistance wiring, reference voltage with high accuracy can be output to the A/D converter circuits; as a result, high-accuracy digital signals can be obtained. The area occupied by the loop resistance wiring in each column on the pixel array can be reduced to the area of one resistor. By the significant reduction in the number of elements, the accuracy of reference voltage itself can be heightened without increasing the circuit size.

In an embodiment of the invention disclosed herein, a loop resistance wiring is shared by a plurality of power supply switches (switches which control output signals from two shift register circuits) and a plurality of output circuits. Accordingly, a high-accuracy reference voltage having a triangular (step-like) wave can be obtained. Further, since the reference voltage can be output from the loop resistance wiring to the plurality of output circuits, A/D converter circuits can be formed with a simple structure of elements. Accordingly, A/D conversion with high accuracy and high resolution can be performed and the circuit size can be reduced.

Thus, sharing of one loop resistance wiring among a plurality of power supply switches and a plurality of output circuits and utilization of a reference voltage having a triangular (step-like) wave generated using the resistance wiring and the plurality of power supply switches can achieve high-accuracy and high-resolution A/D converter circuits whose mounting area is significantly reduced. Since the number of constituent elements of each of the A/D converter circuits is small, variation between the A/D converter circuits provided for the respective columns of the pixel array can be made small.

By using the A/D converter circuits in the output circuit, it is possible to output high-accuracy digital signals.

An embodiment of the present invention is a semiconductor device which includes a plurality of sensor output signal lines each connected to a corresponding one column of sensors arranged in a matrix; an output circuit which is connected to a corresponding one of the plurality of sensor output signal lines and includes an A/D converter circuit that converts an analog signal input to the corresponding one of the sensor output signal lines into a digital signal and output the digital signal; a resistance wiring including a plurality of resistors connected in a loop shape; a first switch which controls connection between the resistance wiring and a first power supply line; a second switch which controls connection between the resistance wiring and a second power supply line; a reference voltage output signal line; and shift registers which control the first switch that is conducting in a first period and the second switch that is conducting in a second period including the first period, with one or more of the resistors connected between the first switch and the second switch in the resistance wiring. The reference voltage output signal line and the A/D converter circuit are connected to each other.

Another embodiment of the present invention is a method for driving a semiconductor device. The semiconductor device includes a plurality of sensor output signal lines each connected to a corresponding one column of sensors arranged in a matrix; output circuits which are each connected to a corresponding one of the plurality of sensor output signal lines and each include a comparator, a counter, and a sample-and-hold circuit; a resistance wiring including a plurality of resistors which are connected in a loop shape and are each connected to a corresponding one of the output circuits; a first switch which controls connection between the resistance wiring and a first power supply line and is connected to a corresponding one of the resistors of the resistance wiring; a second switch which controls connection between the resistance wiring and a second power supply line and is connected to a corresponding one of the resistors of the resistance wiring; a reference voltage output signal line connected to a corresponding one of the resistors of the resistance wiring; and shift registers that control the first switch which is conducting in a first period and the second switch which is conducting in a second period including the first period, with one or more of the resistors connected between the first switch and the second switch in the resistance wiring. The reference voltage output signal line and a corresponding one of the output circuits are connected to each other. The output circuits convert an input analog signal into a digital signal and output the digital signal in the following manner. The sample-and-hold circuit captures a voltage of a corresponding one of the sensor output signal line and holds a value of the voltage constant. The comparator compares the voltage of the corresponding one of the sensor output signal lines with a voltage of the reference voltage output signal line. A high (H) is output when the voltage of the corresponding one of the sensor output signal lines is higher than the voltage of the reference voltage output signal line, and a low (L) is output when the voltage of the corresponding one of the sensor output signal lines is lower than the voltage of the reference voltage output signal line. The counter counts and digitalizes a period in which the high (H) is output.

According to an embodiment of the present invention, a loop resistance wiring is shared by a plurality of output circuits, whereby the mounting area occupied by a readout circuit in each column on a sensor array can be significantly reduced. Further, the generated high-accuracy reference voltages are used and A/D converter circuits with reduced circuit size without a complicated circuit structure are used in the output circuits, whereby high-accuracy digital signals can be obtained. Furthermore, since the number of constituent elements of each of the A/D converter circuits can be significantly reduced, variation between the A/D converter circuits provided for the respective columns of the sensor array can be made small.

DETAILED DESCRIPTION OF THE INVENTION

Embodiment will be described in detail with reference to the accompanying drawings. Note that the present invention is not limited to the description below, and it is easily understood by those skilled in the art that a variety of modifications can be made to the modes and details without departing from the spirit and scope of the present invention. Therefore, the present invention should not be construed as being limited to the description in the following embodiment. Note that in the structures described below, the same portions or portions having similar functions are denoted by the same reference numerals in common in different drawings and repetitive description thereof will be omitted.

In this embodiment, an embodiment of a semiconductor device incorporating a readout circuit that can have a reduced size and output a high-accuracy digital signal will be described with reference to FIG. 1, FIG. 2, FIGS. 3A to 3D, FIG. 4, and FIG. 5.

Figure 1:
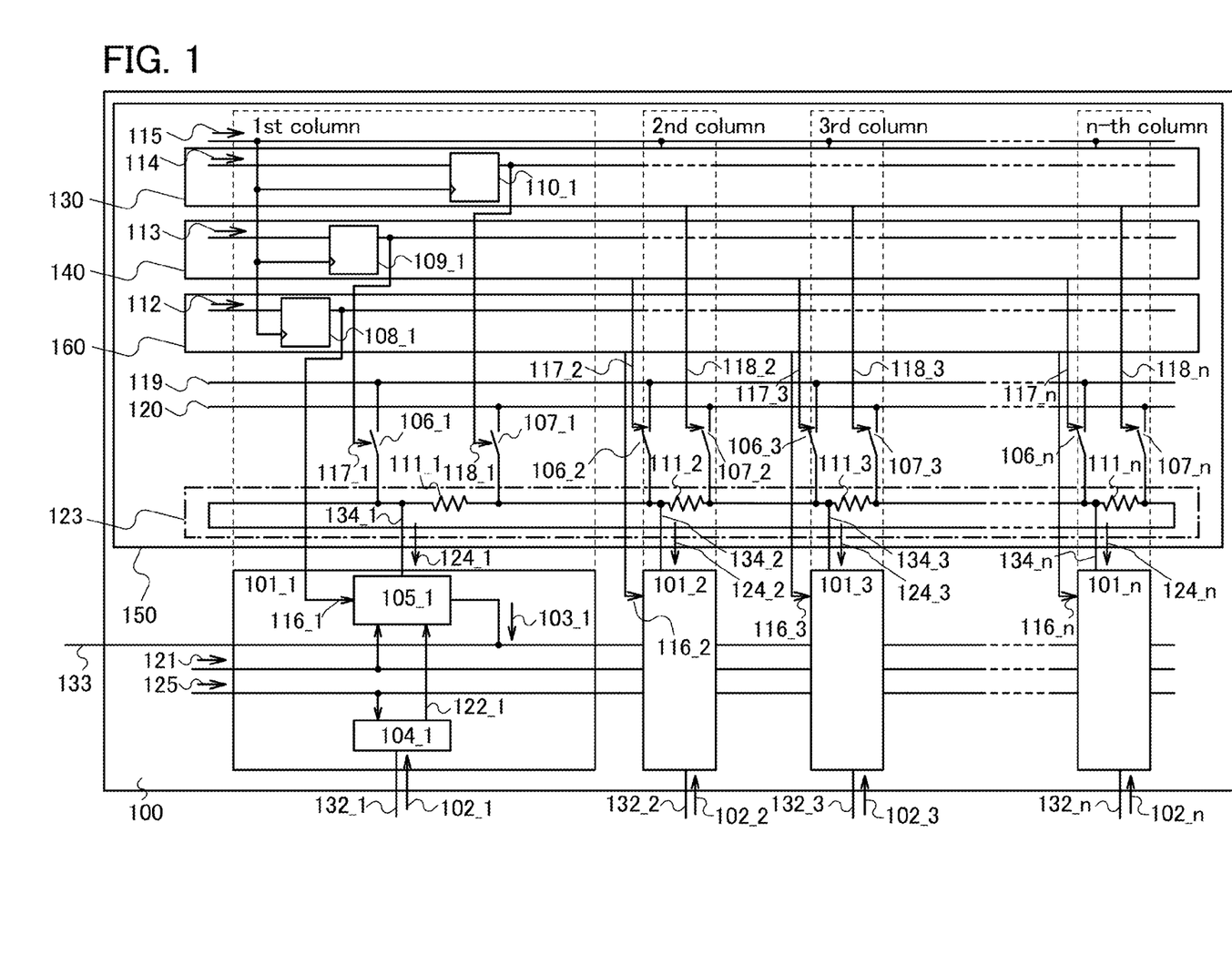
FIG. 1 illustrates a readout circuit according to Embodiment 1.

FIG. 1 illustrates a configuration of a readout circuit 100 which A/D converts signals (analog signals) that are output from a plurality of pixels formed in a matrix and input through a plurality of sensor output signal lines and outputs digital signals. The readout circuit 100 includes a plurality of output circuits 101 (101_1 to 101_$n$ ($n$ is a natural number)) provided for different columns of the plurality of pixels formed in a matrix, a reference voltage generation circuit 150, a plurality of sensor output signal lines 132 (132_1 to 132_$n$), a plurality of reference voltage output signal lines 134 (134_1 to 134_$n$), and an output signal line 133. The output circuits 101 A/D convert output signals 102 (102_1 to 102_$n$) and sequentially output output signals 103 (103_1 to 103_$n$).

The output circuits 101 include A/D converter circuits 105 (105_1 to 105_$n$) and sample-and-hold circuits 104 (104_1 to 104_$n$).

The output signals 102 of the pixels are input to the sample-and-hold circuits 104 through the sensor output signal lines 132 and the voltage value of the output signals 102 at a certain timing is held constant. Output signals 122 (122_1 to 122_$n$) held in the sample-and-hold circuits 104 are output therefrom to the A/D converter circuits 105. A control signal 121 for controlling the A/D converter circuits 105 and a control signal 125 for controlling the sample-and-hold circuits 104 are input to the A/D converter circuits 105 and the sample-and-hold circuits 104, respectively.

The reference voltage generation circuit 150 includes one loop resistance wiring 123, a first shift register 130, a second shift register 140, a third shift register 160, a plurality of power supply switches 106 (106_1 to 106_n), a plurality of power supply switches 107 (107_1 to 107_n), a first power supply line 119, and a second power supply line 120.

Resistors 111 (111_1 to 111_n) are provided for the respective columns of the plurality of pixels formed in a matrix. The plurality of resistors 111 which are connected in series in a loop shape constitute the loop resistance wiring 123.

The reference voltage generation circuit 150 generates reference voltages having a triangular (step-like) wave which changes (increases and decreases) with time, using the loop resistance wiring 123 and the plurality of power supply switches 106 and 107. In addition, the reference voltage generation circuit 150 outputs the generated reference voltages as output signals 124 to the output circuits 101 provided for the respective columns through the reference voltage output signal lines 134 (134_1 to 134_n). That is, reference voltages of the triangular (step-like) waves are supplied to the output circuits 101 as the output signals 124 (124_1 to 124_n).

In each column, the output circuit 101, the resistor 111, the power supply switch 106, the power supply switch 107, a latch circuit 108, a latch circuit 109, and a latch circuit 110 are provided. For size reduction, it is preferable that these elements are arranged at the same interval as the pixels.

The latch circuits 110 (110_1 to 110_n) which are provided for the respective columns and connected in parallel constitute the first shift register 130. Signals output from the latch circuits 110 in the respective columns are output signals 118 (118_1 to 118_n). Note that the output signals 118 control the power supply switches 107 provided for the respective columns. The latch circuits 109 (109_1 to 109_n) which are arranged for the respective columns and connected in parallel constitute the second shift register 140. Signals output from the latch circuits 109 in the respective columns are output signals 117 (117_1 to 117_n). The output signals 117 control the power supply switches 106 provided for the respective columns The latch circuits 108 (108_1 to 108_n) which are provided for the respective columns and connected in parallel constitute the third shift register 160. Signals output from the latch circuits 108 in the respective columns are output signals 116 (116_1 to 116_n). The control signals 116 control the A/D converter circuits 105 (105_1 to 105_n) provided for the respective columns.

The first shift register 130 receives a start signal 114 and operates in synchronization with a clock signal 115. The second shift register 140 receives a start signal 113 and operates in synchronization with the clock signal 115. The third shift register 160 receives a start signal 112 and operates in synchronization with the clock signal 115.

The power supply switches 106 are connected to the first power supply line 119, and on/off of the power supply switches 106 is controlled by the output signals 117 which are output from the respective columns of the second shift register 140, whereby the voltage supplied to the loop resistance wiring 123 can be controlled. The power supply switches 107 are connected to the second power supply line 120, and on/off of the power supply switches 107 is controlled by the output signals 118 which are output from the respective columns of the first shift register 130, whereby the voltage supplied to the loop resistance wiring 123 can be controlled. With the power supply switches 106 and the power supply switches 107, at least two levels of voltage can be supplied to the loop resistance wiring 123.

Figure 2:
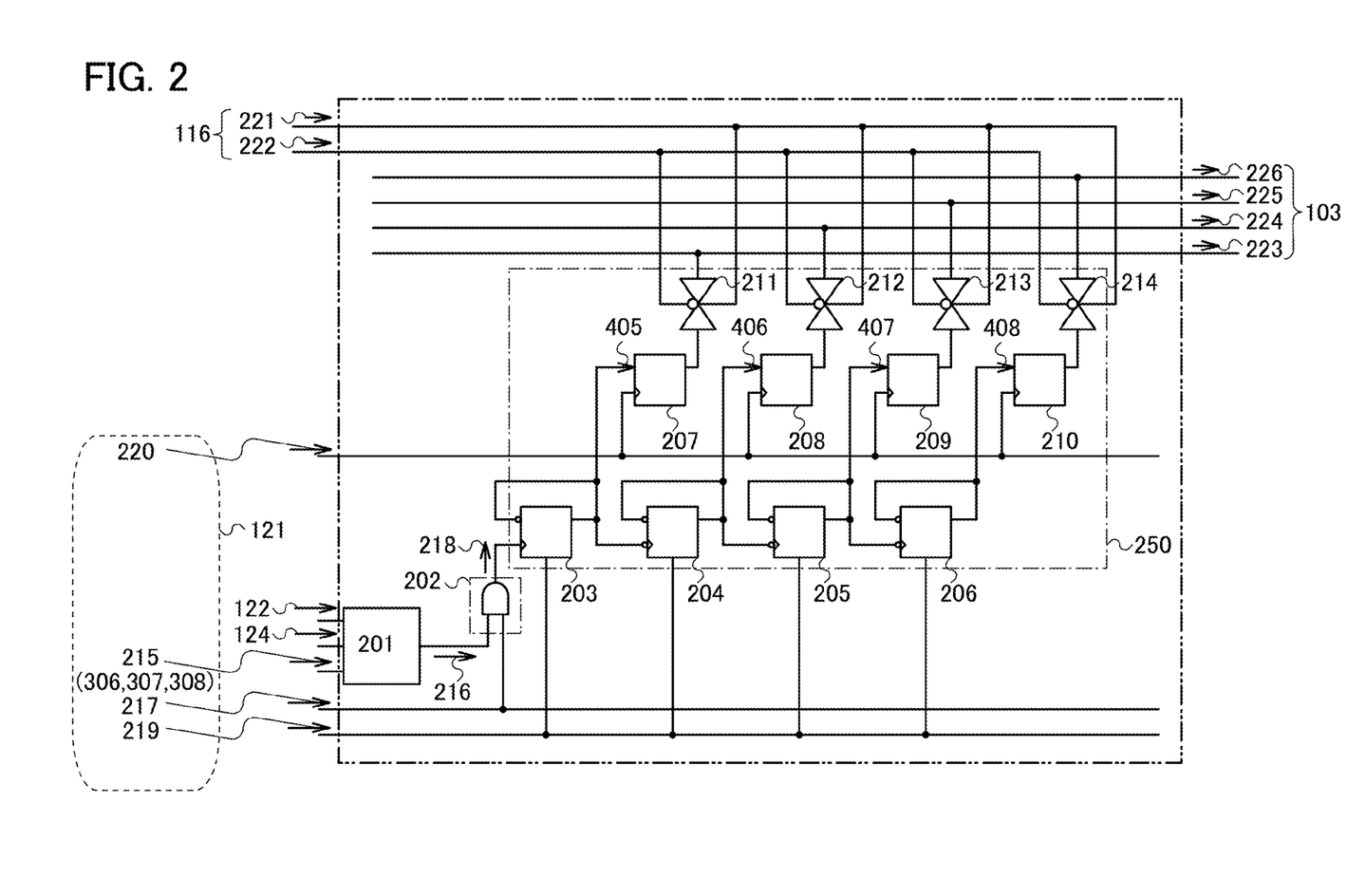
FIG. 2 illustrates an A/D converter circuit according to Embodiment 1.

FIG. 2 illustrates a configuration of the A/D converter circuit 105. The A/D converter circuit 105 includes a comparator 201, a control circuit 202, a flip-flop 203, a flip-flop 204, a flip-flop 205, a flip-flop 206, a latch circuit 207, a latch circuit 208, a latch circuit 209, a latch circuit 210, a switch 211, a switch 212, a switch 213, and a switch 214. As well as the output signal 122 and the output signal 124, the control signal 116 (a control signal 221 and a control signal 222 in FIG. 2) and the control signal 121 (a control signal 215, a clock signal 217, a reset signal 219, and a control signal 220) are input to the A/D converter circuit 105. A digital signal produced by A/D conversion is output as the output signal 103 (an output signal 223, an output signal 224, an output signal 225, and an output signal 226).

Figure 3A:
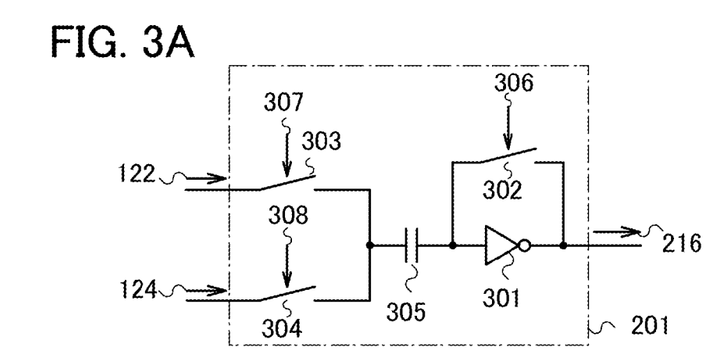
FIGS. 3A to 3D illustrate comparators according to Embodiment 1.

The comparator 201 compares the output signal 122 that is output from the sample-and-hold circuit with the output signal 124 that is output from the reference voltage generation circuit in response to the control signal 215 (a control signal 306, a control signal 307, and a control signal 308 in FIG. 3A), and outputs a result of the comparison as an output signal 216. It is assumed in this embodiment that the comparator 201 outputs a high ("H") as the output signal 216 in the case where the potential of the output signal 122 that is output from the sample-and-hold circuit is higher than the potential of the output signal 124. Further, the comparator 201 is assumed to output a low ("L") as the output signal 216 in the case where the potential of the output signal 122 is lower than the potential of the output signal 124.

In the case where the comparator 201 outputs "H" as the output signal 216, an output signal 218 output from the control circuit 202 has the same value as the clock signal 217. In this case, a 4-bit asynchronous counter circuit 250 performs counting in response to the output signal 218 from the control circuit 202. That is, when the output signal 216 is "H", counting of the output signal 218 is possible. In the case where the comparator 201 outputs "L" as the output signal 216, the output signal 218 from the control circuit 202 has the same value as the output signal 216 regardless of the clock signal 217. In this case, the 4-bit asynchronous counter circuit 250 does not perform counting.

The 4-bit asynchronous counter circuit 250 includes the flip-flop 203, the flip-flop 204, the flip-flop 205, the flip-flop 206, the latch circuit 207, the latch circuit 208, the latch circuit 209, the latch circuit 210, the switch 211, the switch 212, the switch 213, and the switch 214. Although the counter circuit 250 in FIG. 2 is a 4-bit asynchronous counter circuit, it can be a 4-bit synchronous counter circuit. Further, the bit number of the counter circuit 250 may be other than 4 and is not particularly limited.

In other words, the magnitude of an analog signal is reflected in a period in which the output signal 216 is "H", and a clock signal in the period is output as the output signal 218. The output signal 218 is counted by the 4-bit asynchronous counter circuit 250 and digitalized; thus, a digital signal can be obtained. The A/D converter circuit includes at least the comparator 201 that can compare the output signal 122 with the output signal 124 and the counter circuit 250 that can count and digitalize the output signal 218. Therefore, an A/D converter circuit can be formed with an extremely simple circuit configuration using only digital circuits that are advantageous for miniaturization, without the need for a high-accuracy analog circuit.

The reset signal 219 is input to all of the flip-flop 203, the flip-flop 204, the flip-flop 205, and the flip-flop 206. When "H" is output as the reset signal 219, an output signal 405 from the flip-flop 203, an output signal 406 from the flip-flop 204, an output signal 407 from the flip-flop 205, and an output signal 408 from the flip-flop 206 are all brought "L". Note that the control signal 215, the clock signal 217, the reset signal 219, and the control signal 220 correspond to the control signal 121 of the A/D converter circuit in FIG. 1.

The output signal 405 from the flip-flop 203, the output signal 406 from the flip-flop 204, the output signal 407 from the flip-flop 205, and the output signal 408 from the flip-flop 206 are held in the latch circuit 207, the latch circuit 208, the latch circuit 209, and the latch circuit 210 respectively, in accordance with the control signal 220. That is, when the control signal 220 is "H", the state of the output signal 405 ("H" or "L"), the state of the output signal 406 ("H" or "L"), the state of the output signal 407 ("H" or "L"), and the state of the output signal 408 ("H" or "L") are held in the latch circuit 207, the latch circuit 208, the latch circuit 209, and the latch circuit 210, respectively. To be more precise, in a period when the output signal 216 is "H", the counter circuit 250 performs counting, and at the moment the control signal 220 changes from "L" to "H", the state of the output signal in each of the flip-flops is held in the corresponding latch circuit.

An output of the latch circuit 207 is output as the output signal 223 in accordance with the control signals 221 and 222. An output of the latch circuit 208 is output as the output signal 224 in accordance with the control signals 221 and 222. An output of the latch circuit 209 is output as the output signal 225 in accordance with the control signals 221 and 222. An output of the latch circuit 210 is output as the output signal 226 in accordance with the control signals 221 and 222. The output signal 223, the output signal 224, the output signal 225, and the output signal 226 correspond to the output signal 103 produced by A/D conversion.

Through the above-described A/D conversion, the output signal 102 (analog signals) which is output from each column of the plurality of pixels formed in a matrix is converted into the output signal 223, the output signal 224, the output signal 225, and the output signal 226 (digital signals). The digital signals can be utilized in digital electronic devices. Note that the control signal 221 and the control signal 222 correspond to the control signal 116 of the A/D converter circuit in FIG. 1.

Figure 3B:
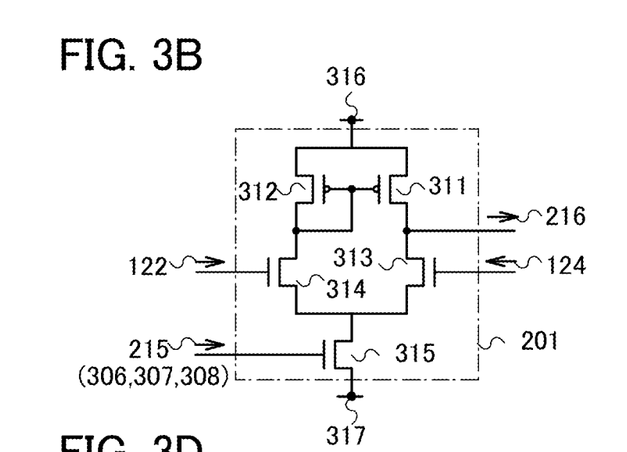
Figure 3C:
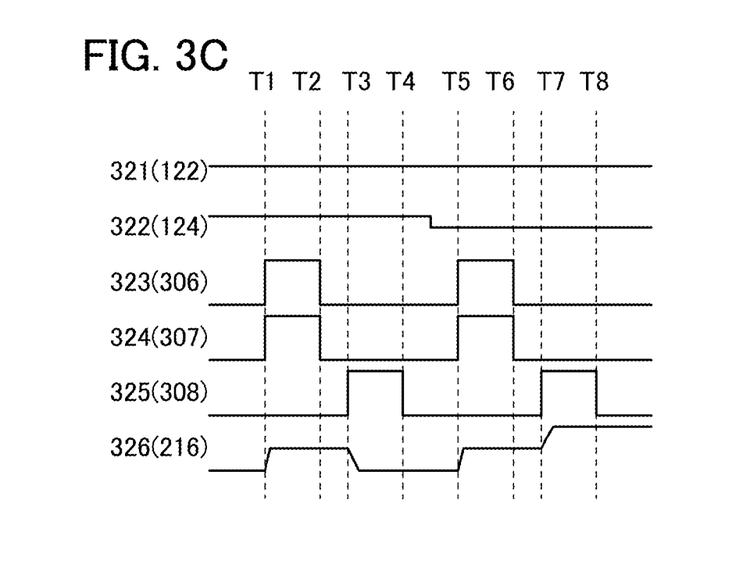
Figure 3D:
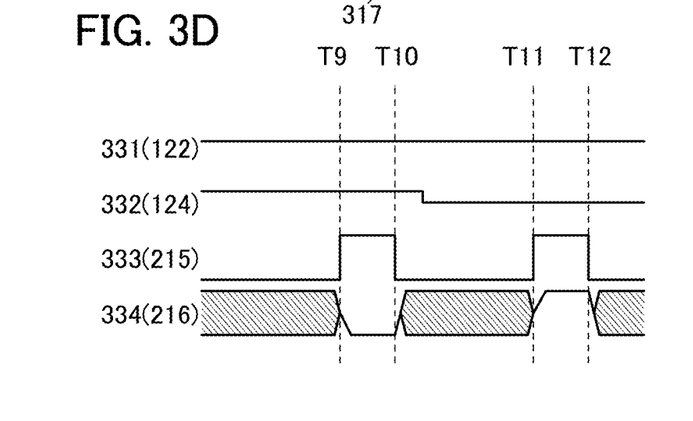

FIGS. 3A to 3D illustrate configurations of the comparator 201. FIG. 3A illustrates a switched capacitor comparator, and FIG. 3B illustrates a differential amplifier circuit. FIG. 3C is a timing chart of the switched capacitor comparator, and FIG. 3D is a timing chart of the differential amplifier circuit.

As illustrated in FIG. 3A, an inverter 301, a switch 302, a switch 303, a switch 304, and a capacitor 305 constitute the switched capacitor comparator. The switch 302 is controlled by the control signal 306, the switch 303 is controlled by the control signal 307, and the switch 304 is controlled by the control signal 308. Note that the control signal 306, the control signal 307, and the control signal 308 correspond to the control signal 215 in FIG. 2.

An output signal 321 in FIG. 3C corresponds to the output signal 122 in FIG. 3A, an output signal 322 in FIG. 3C corresponds to the output signal 124 in FIG. 3A, and an output signal 326 in FIG. 3C corresponds to the output signal 216 in FIG. 3A. A control signal 323, a control signal 324, and a control signal 325 in FIG. 3C correspond to the control signal 306, the control signal 307, and the control signal 308 in FIG. 3A.

During a period from Time T1 to Time T2 (T5 to T6), the switch 302 and the switch 303 are on in the case where the control signal 306 and the control signal 307 are "H". In this period, an input terminal and an output terminal of the inverter 301 are short-circuited, and the voltage of the input terminal becomes equal to that of the output terminal A potential difference between the voltage of the input terminal (output terminal) of the inverter circuit 301 (Vth) and an output voltage of the sample-and-hold circuit (Vin), which is represented by ΔV1 (ΔV1=Vth−Vin), is applied to the capacitor 305, and electric charge is accumulated therein.

During a period from Time T3 to Time T4 (T7 to T8), the switch 304 is on in the case where the control signal 308 is "H". In this period, the voltage of a terminal of the capacitor 305 on the switch 304 side increases by a potential difference between the output voltage of the reference voltage generation circuit (Vref) and the output voltage of the sample-and-hold circuit (Vin), which is represented by ΔV2 (ΔV2=Vref−Vin). Here, since electric charge accumulated in the capacitor 305 remains held, the voltage of a terminal of the capacitor 305 on the inverter 301 side also increases by ΔV2.

Here, in the case where ΔV2>0 (Vref>Vin), the voltage of the output terminal of the inverter circuit, that is, the output signal 216 (the output voltage of the comparator 201) is "L"; while in the case where ΔV2<0 (Vref<Vin), the voltage of the output terminal of the inverter, that is, the output signal 216 (the output voltage of the comparator 201) is "H".

That is, in the case where the potential of the output signal 122 (the output voltage of the sample-and-hold circuit) is higher (lower) than that of the output signal 124 (the output voltage of the reference voltage generation circuit), the output signal 216 (the output voltage of the comparator 201) becomes "H" ("L").

As illustrated in FIG. 3B, a transistor 311, a transistor 312, a transistor 313, a transistor 314, a transistor 315, a high-potential power supply line 316, and a low-potential power supply line 317 constitute the differential amplifier circuit.

An output signal 331 in FIG. 3D corresponds to the output signal 122 in FIG. 3B, an output signal 332 in FIG. 3D corresponds to the output signal 124 in FIG. 3B, and an output signal 334 in FIG. 3D corresponds to the output signal 216 in FIG. 3B. A control signal 333 in FIG. 3D corresponds to the control signal 215 in FIG. 3B.

During a period from Time T9 to Time T10 (T11 to T12), the comparator 201 operates in the case where the control signal 215 is "H". In this period, if the potential of the output signal 122 (the output voltage from the sample-and-hold circuit) is higher (lower) than that of the output signal 124 (the output voltage of the reference voltage generation circuit), the output signal 216 (the output voltage from the comparator 201) becomes "H" ("L").

Figure 4:
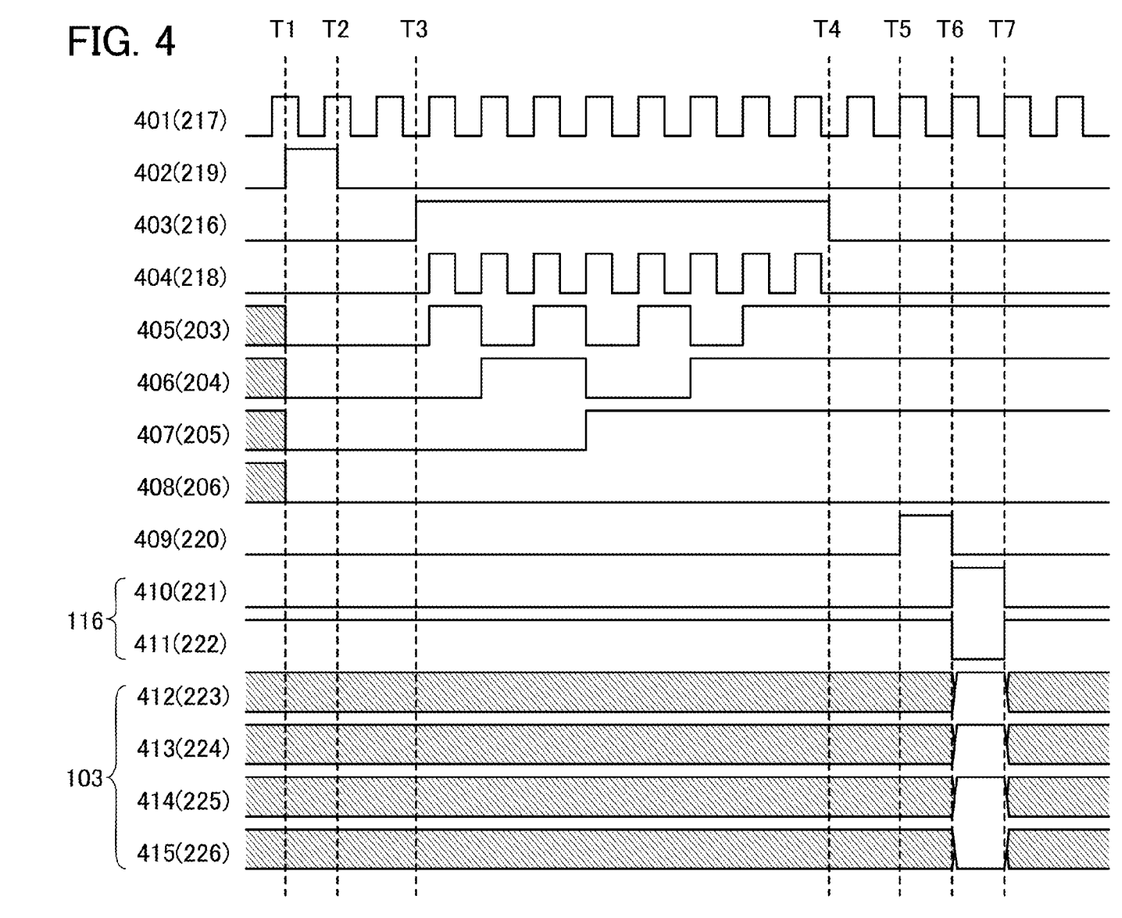
FIG. 4 is a timing chart of an A/D converter circuit according to Embodiment 1.

FIG. 4 is a timing chart of the A/D converter circuit 105. A clock signal 401 corresponds to the clock signal 217 in FIG. 2, a reset signal 402 corresponds to the reset signal 219 in FIG. 2, an output signal 403 corresponds to the output signal 216 in FIG. 2, and an output signal 404 corresponds to the output signal 218 from the control circuit 202 in FIG. 2.

An output signal 405, an output signal 406, an output signal 407, and an output signal 408 correspond to the output signal from the flip-flop 203, the output signal from the flip-flop 204, the output signal from the flip-flop 205, and the output signal from the flip-flop 206 in FIG. 2, respectively.

A control signal 409 corresponds to the control signal 220 in FIG. 2. A control signal 410 and a control signal 411 correspond to the control signal 221 and the control signal 222 in FIG. 2, respectively. Note that the control signal 410 and the control signal 411 correspond to the control signal 116 of the A/D converter circuit in FIG. 1.

An output signal 412, an output signal 413, an output signal 414, and an output signal 415 correspond to the output signal 223 from the latch circuit 207 in FIG. 2, the output signal 224 from the latch circuit 208 in FIG. 2, the output signal 225 from the latch circuit 209 in FIG. 2, and the output signal 226 from the latch circuit 210 in FIG. 2, respectively.

In a period from Time T1 to Time T2, the output signal 405, the output signal 406, the output signal 407, and the output signal 408 (the output signals from the flip-flop 203, the flip-flop 204, the flip-flop 205, and the flip-flop 206 which constitute the counter 250) are brought "L" in the case where the reset signal 402 is "H".

During a period from Time T3 to Time T4, in the case where the output signal 403 from the comparator 201 is "H", the output signal 404 from the control circuit 202 has the same value as the clock signal 401 (the clock signal 217) and the counter circuit counts.

At Time T4, the output signal 405, the output signal 406, the output signal 407, and the output signal 408 (the output signals from the flip-flop 203, the flip-flop 204, the flip-flop 205, and the flip-flop 206 which constitute the counter 250) are "H", "H", "H", and "L", respectively.

During a period from Time T5 to Time T6, in the case where the control signal 409 (the control signal 220) is "H", the output signal 405 from the flip-flop 203, the output signal 406 from the flip-flop 204, the output signal 407 from the flip-flop 205, and the output signal 408 from the flip-flop 206 are held in the latch circuit 207, the latch circuit 208, the latch circuit 209, and the latch circuit 210, respectively. In this case, the latch circuit 207, the latch circuit 208, the latch circuit 209, and the latch circuit 210 hold "H", "H", "H", and "L", respectively.

During a period from Time T6 to Time T7, in the case where the control signal 410 (the control signal 221) is "H" and the control signal 411 (the control signal 222) is "L", the switch 211, the switch 212, the switch 213, and the switch 214 are controlled to make the latch circuit 207, the latch circuit 208, the latch circuit 209, and the latch circuit 210 output the output signal 412, the output signal 413, the output signal 414, and the output signal 415, respectively. These output signals serve as the output signal 103 (digital signal) produced through A/D conversion by the A/D converter circuit.

Figure 5:
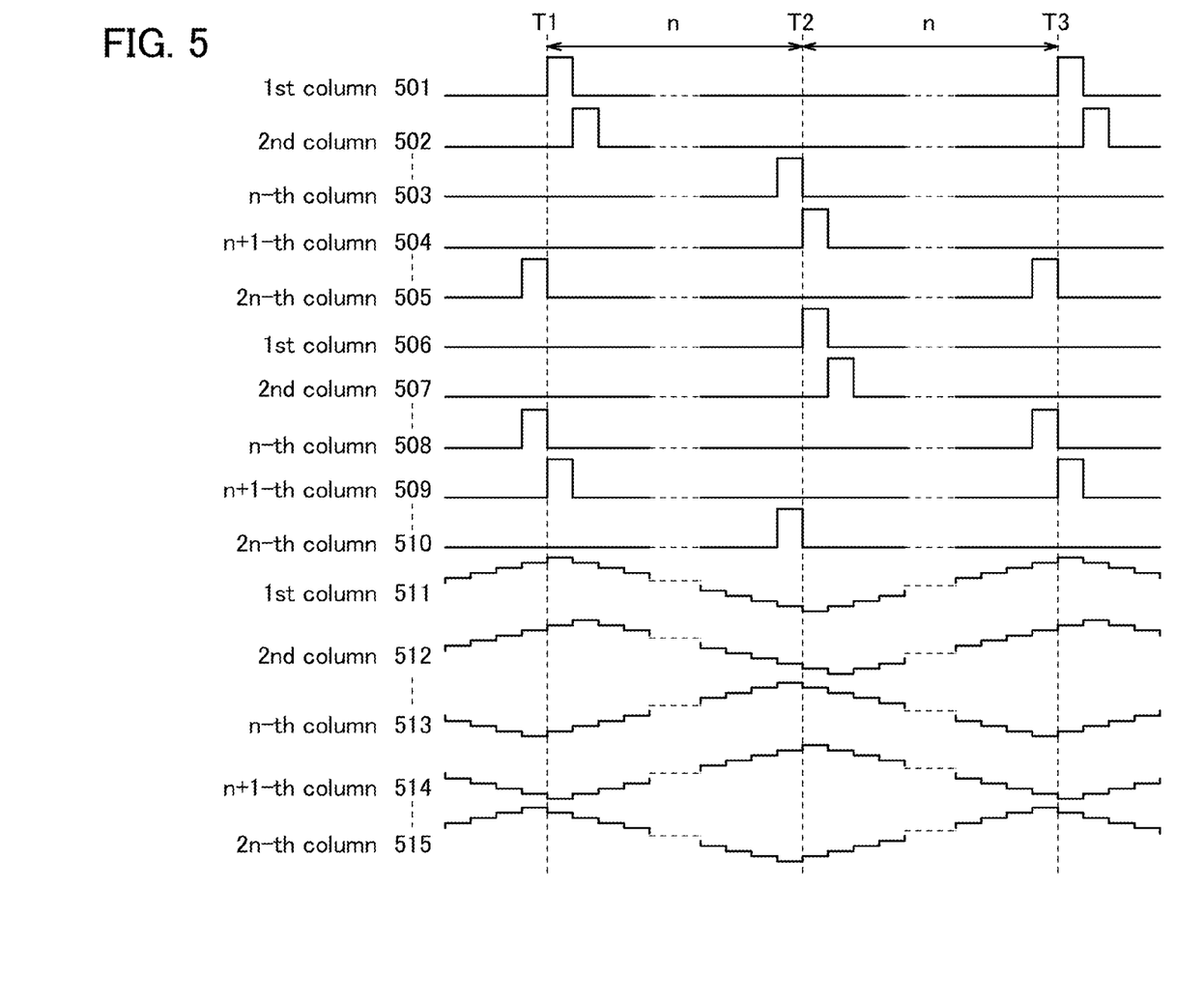
FIG. 5 is a timing chart of a reference voltage generation circuit according to Embodiment 1.

FIG. 5 is a timing chart of the reference voltage generation circuit 150. Although FIG. 5 shows a case in which the output circuits provided for the respective columns of the plurality of pixels formed in a matrix are arranged in an even number of columns (2n), the present invention is not limited to this structure. The output circuits provided for the respective columns may be arranged in an odd number of columns (2n+1). In the case of the structure with an odd number of columns, it is effective to provide a dummy column to form an even number of columns.

A signal 501 corresponds to the output signal 117_1 output from the first-stage latch circuit 109 of the second shift register 140. A signal 502 corresponds to the output signal 117_2 output from the second-stage latch circuit 109 of the second shift register 140. A signal 503 corresponds to the output signal 117_n output from the n-th-stage latch circuit 109 of the second shift register 140. A signal 504 corresponds to the output signal 117_(n+1) output from the (n+1)-th-stage latch circuit 109 of the second shift register 140. A signal 505 corresponds to the output signal 117_2n output from the 2n-th-stage latch circuit 109 of the second shift register 140.

A signal 506 corresponds to the output signal 118_1 output from the first-stage latch circuit 110 of the first shift register 130. A signal 507 corresponds to the output signal 118_2 output from the second-stage latch circuit 110 of the first shift register 130. A signal 508 corresponds to the output signal 118_n output from the n-th-stage latch circuit 110 of the first shift register 130. A signal 509 corresponds to the output signal 118_(n+1) output from the (n+1)-th-stage latch circuit 110 of the first shift register 130. A signal 510 corresponds to the output signal 118_2n output from the 2n-th-stage latch circuit 110 of the first shift register 130.

A signal 511 corresponds to the output signal 124_1 output from the reference voltage output signal line 134_1, which is in the first column of the reference voltage generation circuit, 150. A signal 512 corresponds to the output signal 124_2 output from the reference voltage output signal line 134_2 in the second column of the reference voltage generation circuit 150. A signal 513 corresponds to the output signal 124_n output from the reference voltage output signal line 134_n in the n-th column of the reference voltage generation circuit 150. A signal 514 corresponds to the output signal 124_(n+1) output from the reference voltage output signal line 134_(n+1) in the (n+1)-th column of the reference voltage generation circuit 150. A signal 515 corresponds to the output signal 124_2n output from the reference voltage output signal line 134_2n in the 2n-th column of the reference voltage generation circuit 150. Note that a high potential is supplied to the first power supply line 119, and a low potential is supplied to the second power supply line 120.

The reference voltage generation circuit 150 operates with a cycle; one cycle corresponds to a period from Time T1 to Time T3. In the second shift register 140 constituted by 2n latch circuits 109, any of the power supply switches 106 which are controlled by the output signals 117 from the latch circuits 109 provided for the respective columns is turned on. In the first shift register 130 constituted by 2n latch circuits 110, any of the power supply switches 107 which are controlled by the output signals 118 from the latch circuits 110 provided for the respective columns is turned on.

Here, if the output signal 117_1 (signal 501) from the first-stage latch circuit 109 of the second shift register 140 is "H", that is, if the power supply switch 106_1 in the first column is on, and in addition if the output signal 118_(n+1) (signal 509) from the (n+1)-th latch circuit 110 of the first shift register 130 is "H", that is, if the power supply switch 107_(n+1) in the (n+1)-th column is on, the signal 511 (the output signal 124_1 in the first column of the reference voltage generation circuit 150) becomes a high-level signal, and the signal 514 (the output signal 124_(n+1) in the (n+1)-th column of the reference voltage generation circuit 150) becomes a low-level signal. The potentials of the output signals 124 in the other columns are divided by the resistors 111 that are provided for the respective columns in the loop resistance wiring 123. From the second to n-th columns, the potential of the output signal 124 gradually decreases from the potential value of the output signal 124_1 in the first column (signal 511). From the (n+2)-th to 2n-th columns, the potential of the output signal 124 gradually increases from the potential value of the output signal 124_(n+1) in the (n+1)-th column (signal 514).

Similarly, if the output signal 117_2 (signal 502) from the second-stage latch circuit 109 of the second shift register 140 is "H", that is, if the power supply switch 106_2 in the second column is on, and in addition if the output signal 118_(n+2) from the (n+2)-th latch circuit 110 of the first shift register 130 is "H", that is, if the power supply switch 107_(n+2) in the (n+2)-th column is on, the output signal 124_2 in the second column from the reference voltage generation circuit 150 becomes a high-level signal, and the output signal 124_(n+2) in the (n+2)-th column of the reference voltage generation circuit 150 becomes a low-level signal. The potentials of the output signals 124 in the other columns are divided by the resistors 111 that are provided for the respective columns in the loop resistance wiring 123. From the third to (n+1)-th columns, the potential of the output signal 124 gradually decreases from the potential value of the output signal 124_2 in the second column. From the (n+3)-th to 2n-th columns and further to the first column, the potential of the output signal 124 gradually increases from the potential value of the output signal 124_(n+2) in the (n+2)-th column.

The above-described process is repeated, so that each level of potential obtained by dividing a potential between high potential and low potential into n levels is output twice in one cycle (Time T1 to Time T3) as the output signals 124 in the respective columns from the reference voltage generation circuit 150.

When the reference voltage generation circuit 150 outputs the output signals 124 as reference voltages to the comparators 201 provided for the respective columns in the above-described manner, the comparators 201 are operated. The magnitude of the output signal 122 is reflected in the period in which the output signal 216 is "H". In order that the output signal 216 is "H", the potential of the output signal 122 needs to be higher than the potential of the output signal 124.

Since the "H" output period of the output signal 216 changes in accordance with the magnitude of the output signal 122, the difference between the potential of the output signal 122 and the potential of the output signal 124 is also important to perform high-accuracy and high-resolution A/D conversion. With the above-described structure, the high-accuracy output signal 124 can be obtained; thus, in response to the output signal 124, the high-accuracy output signal 216 can be obtained. Further, since the counter circuit performs counting in accordance with a change in the "H" output period of the output signal 216, the high-accuracy output signal 103 can also be obtained. Thus, errors which are caused in converting an analog signal (the output signal 122) into a digital signal (the output signal 103) can be minimized.

With the above-described structure, a high-accuracy and high-resolution A/D converter circuit can be achieved using minimal components of only digital circuits that are advantageous for miniaturization, without the need for a high-accuracy analog circuit. Further, variation between the A/D converter circuits can be reduced. In particular, in the case of mounting A/D converter circuits in parallel whose circuit structure tends to be complicated on a semiconductor device, usage of the above-described structure of the A/D converter circuit is advantageous for high accuracy and size reduction.

This application is based on Japanese Patent Application serial no. 2011-081376 filed with Japan Patent Office on Apr. 1, 2011, the entire contents of which are hereby incorporated by reference.

What is claimed is:

1. A semiconductor device comprising:
a plurality of sensors arranged in rows and columns;
a plurality of sensor output signal lines wherein the sensors in the same column are connected to a corresponding one of the plurality of sensor output signal lines;
an output circuit connected to the corresponding one of the plurality of sensor output signal lines, the output circuit comprising:
an analog-to-digital converter circuit configured to convert an analog signal input to the corresponding one of the sensor output signal lines from the sensor into a digital signal and output the digital signal;
a resistance wiring including a plurality of resistors connected in series in a loop shape;
a first switch configured to control connection between the resistance wiring and a first power supply line;
a second switch configured to control connection between the resistance wiring and a second power supply line; and
a reference voltage output signal line,
wherein the analog-to-digital converter circuit and the resistance wiring are connected to each other through the reference voltage output signal line, and
wherein one or more of the resistors are connected in series between the first switch and the second switch in the resistance wiring.

2. The semiconductor device according to claim 1, wherein the output circuit includes a sample-and-hold circuit configured to capture the analog signal at a certain timing, hold a value of the analog signal constant, and output the held value of the analog signal to the analog-to-digital converter circuit.

3. The semiconductor device according to claim 1, wherein the analog-to-digital converter circuit includes a counter and a comparator configured to compare a voltage of the sensor output signal line with a voltage of the reference voltage output signal line.

4. The semiconductor device according to claim 3, wherein the comparator is a switched capacitor comparator.

5. The semiconductor device according to claim 3, wherein the comparator is a differential amplifier circuit.

6. The semiconductor device according to claim 3, wherein the counter is an asynchronous counter.

7. The semiconductor device according to claim 3, wherein the counter is a synchronous counter.

8. The semiconductor device according to claim 1, wherein the voltage of the reference voltage output signal line has a triangular (step-like) wave and changes with time.

9. A semiconductor device comprising:
a plurality of sensors arranged in rows and columns;
a plurality of sensor output signal lines wherein the sensors in the same column are connected to a corresponding one of the plurality of sensor output signal lines;
an analog-to-digital converter circuit connected to the corresponding one of the plurality of sensor output signal lines, configured to convert an analog signal input to the corresponding one of the sensor output signal lines from the sensor into a digital signal, and configured to output the digital signal;
a resistance wiring including a plurality of resistors connected in a loop shape, wherein the analog-to-digital converter circuit is connected to a corresponding one of the plurality of resistors;
a first switch configured to control connection between the resistance wiring and a first power supply line, the first switch being connected to a corresponding one of the resistors of the resistance wiring;
a second switch configured to control connection between the resistance wiring and a second power supply line, the second switch being connected to a corresponding one of the resistors of the resistance wiring; and
a reference voltage output signal line connected to a corresponding one of the resistors of the resistance wiring,
wherein the analog-to-digital converter circuit and the resistance wiring are connected to each other through the reference voltage output signal line, and
wherein one or more of the resistors are connected in series between the first switch and the second switch in the resistance wiring.

10. The semiconductor device according to claim 9, further comprising a sample-and-hold circuit connected to the sensor output signal line and the analog-to-digital converter circuit, wherein the sample-and-hold circuit captures the analog signal at a certain timing, holds a value of the analog signal constant, and outputs the held value of the analog signal to the analog-to-digital converter circuit.

11. The semiconductor device according to claim 9, wherein the analog-to-digital converter circuit includes a counter and a comparator configured to compare a voltage of the sensor output signal line with a voltage of the reference voltage output signal line.

12. The semiconductor device according to claim 11, wherein the comparator is a switched capacitor comparator.

13. The semiconductor device according to claim 11, wherein the comparator is a differential amplifier circuit.

14. The semiconductor device according to claim 11, wherein the counter is an asynchronous counter.

15. The semiconductor device according to claim 11, wherein the counter is a synchronous counter.

16. The semiconductor device according to claim 9, wherein the voltage of the reference voltage output signal line has a triangular (step-like) wave and changes with time.

17. A method for driving a semiconductor device including:
- a plurality of sensors arranged in rows and columns;
- a plurality of sensor output signal lines wherein the sensors in the same column are connected to a corresponding one of the plurality of sensor output signal lines;
- output circuits each connected to a corresponding one of the plurality of sensor output signal lines and each including a comparator, a counter, and a sample-and-hold circuit;
- a resistance wiring including a plurality of resistors connected in series in a loop shape, the plurality of resistors each being connected to a corresponding one of the output circuits;
- a first switch configured to control connection between the resistance wiring and a first power supply line, the first switch being connected to a corresponding one of the resistors of the resistance wiring;
- a second switch configured to control connection between the resistance wiring and a second power supply line, the second switch being connected to a corresponding one of the resistors of the resistance wiring;
- a reference voltage output signal line connected to a corresponding one of the resistors of the resistance wiring and connected to a corresponding one of the output circuits;
- a first shift register configured to control the first switch so that the first switch is conducting in a first period; and
- a second shift register configured to control the second switch so that the second switch is conducting in a second period including the first period, wherein the first shift register and the second shift register are connected with one or more of the resistors in the resistance wiring provided therebetween.

wherein the sample-and-hold circuit captures a voltage of a corresponding one of the sensor output signal lines at a certain timing, holds a value of the voltage of a corresponding one of the sensor output signal lines constant, and outputs the held value to the comparator, wherein the comparator compares the voltage of the corresponding one of the sensor output signal lines with a voltage of the reference voltage output signal line, wherein a high signal is output when the voltage of the corresponding one of the sensor output signal lines is higher than the voltage of the reference voltage output signal line, wherein a low signal is output when the voltage of the corresponding one of the sensor output signal lines is lower than the voltage of the reference voltage output signal line, wherein the counter counts and digitalizes a period in which the high signal is output, and wherein the output circuits convert an input analog signal into a digital signal and output the digital signal.

* * * * *